United States Patent
Li et al.

(10) Patent No.: US 10,032,766 B2
(45) Date of Patent: Jul. 24, 2018

(54) VDMOS TRANSISTORS, BCD DEVICES INCLUDING VDMOS TRANSISTORS, AND METHODS FOR FABRICATING INTEGRATED CIRCUITS WITH SUCH DEVICES

(71) Applicant: Globalfoundries Singapore Pte. Ltd., Singapore (SG)

(72) Inventors: Ming Li, Singapore (SG); Namchil Mun, Singapore (SG); Jeoung Mo Koo, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 21 days.

(21) Appl. No.: 15/267,627

(22) Filed: Sep. 16, 2016

(65) Prior Publication Data
US 2018/0082997 A1    Mar. 22, 2018

(51) Int. Cl.
| | |
|---|---|
| *H01L 27/06* | (2006.01) |
| *H01L 29/78* | (2006.01) |
| *H01L 29/40* | (2006.01) |
| *H01L 29/10* | (2006.01) |
| *H01L 29/06* | (2006.01) |
| *H01L 27/092* | (2006.01) |

(Continued)

(52) U.S. Cl.
CPC ...... *H01L 27/0617* (2013.01); *H01L 21/8238* (2013.01); *H01L 27/092* (2013.01); *H01L 29/063* (2013.01); *H01L 29/1095* (2013.01); *H01L 29/407* (2013.01); *H01L 29/408* (2013.01); *H01L 29/66681* (2013.01); *H01L 29/66734* (2013.01); *H01L 29/7809* (2013.01); *H01L 29/7813* (2013.01); *H01L 29/7816* (2013.01)

(58) Field of Classification Search
None
See application file for complete search history.

(56) References Cited

U.S. PATENT DOCUMENTS

| | | | | | |
|---|---|---|---|---|---|
| 5,777,362 | A | * | 7/1998 | Pearce | H01L 27/0623 257/335 |
| 7,667,268 | B2 | * | 2/2010 | Disney | H01L 29/0638 257/335 |

(Continued)

*Primary Examiner* — Andres Munoz
(74) *Attorney, Agent, or Firm* — Lorenz & Kopf, LLP

(57) ABSTRACT

VDMOS transistors, Bipolar-CMOS-DMOS (BCD) devices including VDMOS transistors, and methods for fabricating integrated circuits with such devices are provided. In an example, a BCD device having a VDMOS transistor includes a buried layer over a substrate and an epitaxial layer over the buried layer and having an upper surface. Deep trench isolation regions extend from the upper surface of the epitaxial layer, into the substrate, and isolate a VDMOS region from a device region. In the VDMOS region, a source region is adjacent the upper surface, a vertical gate structure extends into the epitaxial layer, a body region is located adjacent the vertical gate structure and forms a channel, and a VDMOS conductive structure extends through the epitaxial layer and into the buried layer, which is a drain for the VDMOS transistor. The VDMOS conductive structure is a drain contact to the buried layer.

20 Claims, 8 Drawing Sheets

(51) Int. Cl.
*H01L 29/66* (2006.01)
*H01L 21/8238* (2006.01)

(56) References Cited

U.S. PATENT DOCUMENTS

| | | | |
|---|---|---|---|
| 2003/0168712 A1* | 9/2003 | Shin | H01L 21/761 257/510 |
| 2003/0219945 A1* | 11/2003 | Lee | H01L 29/66712 438/257 |
| 2004/0232522 A1* | 11/2004 | Shimizu | H01L 21/763 257/548 |
| 2006/0267044 A1* | 11/2006 | Yang | H01L 29/407 257/141 |
| 2008/0023787 A1* | 1/2008 | Shimada | H01L 21/761 257/506 |
| 2013/0200451 A1* | 8/2013 | Yilmaz | H01L 29/407 257/331 |
| 2015/0123194 A1* | 5/2015 | Levin | H01L 27/088 257/329 |

* cited by examiner

VDMOS TRANSISTORS, BCD DEVICES INCLUDING VDMOS TRANSISTORS, AND METHODS FOR FABRICATING INTEGRATED CIRCUITS WITH SUCH DEVICES

TECHNICAL FIELD

The technical field generally relates to vertical diffused metal oxide semiconductor (VDMOS) transistors, and more particularly relates to the integration of VDMOS transistors in bipolar-CMOS-DMOS (BCD) devices.

BACKGROUND

The efficiency of BCD devices could be improved if trench-based VDMOS (TB-VDMOS or TB-MOS) transistors could be added to existing integrated BCD process flows. Specifically, trench-based VDMOS transistors provide improved $R_{on}$ scaling as compared to planar gate VDMOS or laterally diffused MOS (LDMOS) transistors. A mechanical switch's "on/off" state is determined by physically changing the switch's position. Transistor switches use an electrical input at the gate of the transistor to turn "on" or "off". A positive voltage turns the switch on and a negative voltage turns it off. In design schematics, the "on" state is represented as a resistor and the "off" state as a capacitor. A low resistance allows more of the signal to travel from one port to another when the switch is on. This metric is called $R_{on}$. $R_{on}$ is inversely proportional to the width of the conventional transistor. The wider the transistor is, the lower the resistance is, which allows more of the signal to get through.

Thus, the integration of trench-based VDMOS in BCD devices has great potential to improve high voltage (HV) device performance, through improved $R_{on}$. Further, trench-based VDMOS may provide enhanced device breakdown voltage (BV). However, methods to integrate trench-based VDMOS transistors in BCD devices include time intensive and difficult processing techniques and are not cost effective. For example, prior methods have used high energy implantation and diffusion process using phosphorous oxychloride ($POCl_3$), as well as long duration drive-in processing to connect a buried drain layer to the device front side for drain connection, and long duration LOCOS oxidation processing to form breakdown voltage enhancement regions.

Accordingly, it is desirable to provide improved trench-based VDMOS transistors, such as trench-based VDMOS transistors in BCD devices. Further, it is desirable to provide a method for fabricating an integrated circuit including a trench-based VDMOS transistor that is cost effective and time efficient. Also, it is desirable to integrate trench-based VDMOS transistors in BCD device process flow. Furthermore, other desirable features and characteristics will become apparent from the subsequent detailed description and the appended claims, taken in conjunction with the accompanying drawings and this background.

BRIEF SUMMARY

VDMOS transistors, Bipolar-CMOS-DMOS (BCD) devices including VDMOS transistors, and methods for fabricating integrated circuits with such devices are provided. In an example, a BCD device having a VDMOS transistor includes a buried layer over a substrate and an epitaxial layer over the buried layer and having an upper surface. Deep trench isolation regions extend from the upper surface of the epitaxial layer, into the substrate, and isolate a VDMOS region from a device region of the epitaxial layer. In the VDMOS region, a source region is adjacent the upper surface of the epitaxial layer, a vertical gate structure extends into the epitaxial layer, a body region of the epitaxial layer is located adjacent the vertical gate structure and forms a channel, and a VDMOS conductive structure extends through the epitaxial layer and into the buried layer, which is a drain for the VDMOS transistor. The VDMOS conductive structure is a drain contact to the buried layer.

In another exemplary embodiment, a VDMOS transistor is provided and includes a buried drain formed over a substrate. The VDMOS transistor further includes an epitaxial layer located over the buried drain and having an upper surface. A doped source region is located at the upper surface of the epitaxial layer. Further, a vertical gate structure extends into the epitaxial layer and is a gate electrode for the VDMOS transistor. Also, a body region is located below the doped source region and adjacent the vertical gate structure and forms a channel of the VDMOS transistor. Current flows between the doped source region and the buried drain in a direction transverse to the upper surface. The VDMOS transistor device further includes a conductive structure extending through the epitaxial layer and into the buried drain. The conductive structure is a drain contact to the buried drain.

In yet another exemplary embodiment, a method for fabricating an integrated circuit with a BCD device is provided. The method includes providing a substrate and forming a buried layer over the substrate. The method further includes growing an epitaxial layer over the buried layer, wherein the epitaxial layer has an upper surface. The method includes forming deep trench isolation regions extending from the upper surface of the epitaxial layer and into the substrate, wherein the deep trench isolation regions isolate a VDMOS region of the epitaxial layer therebetween. The method includes forming a body region at the upper surface of the epitaxial layer in the VDMOS region. Further, the method includes forming a vertical gate structure extending through the body region and into the epitaxial layer in the VDMOS region, wherein the vertical gate structure is a VDMOS gate electrode. Also, the method includes forming a VDMOS source region at the upper surface of the epitaxial layer in the VDMOS region. The method includes forming a conductive structure extending through the epitaxial layer and into the buried layer in the VDMOS region. The buried layer in the VDMOS region is a VDMOS drain and the conductive structure is a drain contact to the VDMOS drain.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
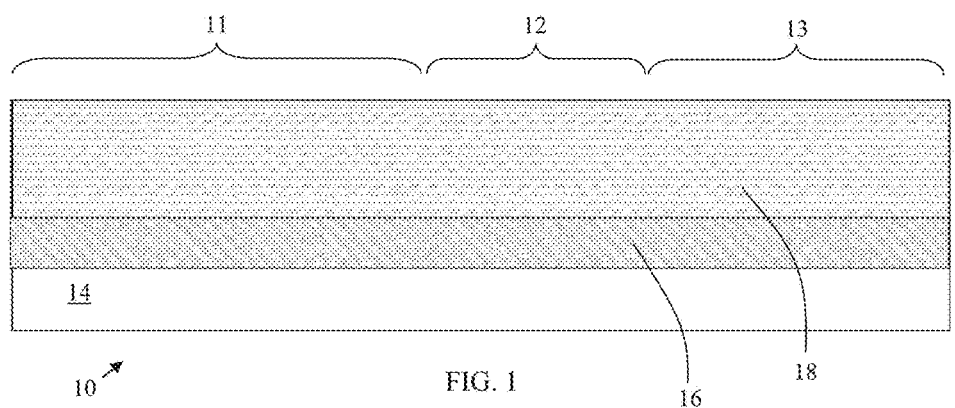
FIGS. 1-14 illustrate cross sectional views of processing of a portion of an integrated circuit for forming a trench-based VDMOS transistor in a BCD process flow according to an embodiment herein.

The following detailed description is merely exemplary in nature and is not intended to limit the VDMOS transistors, BCD devices including VDMOS transistors, and methods for fabricating integrated circuits with VDMOS transistors. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of transistor devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

While "MOS" originally referred to metal-oxide-semiconductor transistors, as used herein "MOS" transistors designate all types of insulated-gate field effect transistors, whether or not such transistors include metal gates, as the term "MOS" is commonly applied in the industry. For example, "MOS" transistors include those transistors utilizing silicon gate technologies that use doped polysilicon gates and silicided gates.

As described herein, an exemplary trench-based VDMOS transistor is provided with a buried drain layer. In an exemplary embodiment, the buried drain layer is blanket deposited over the substrate. An exemplary VMOS transistor includes an epitaxial layer that is grown over the buried drain layer. In exemplary embodiments, deep trench isolation regions extend from the surface of the epitaxial layer, through the buried drain layer, and into the substrate. Such deep trench isolation regions may isolate a device region where the trench-based VDMOS is formed.

In an exemplary embodiment, a doped body region is formed in the epitaxial layer and a vertical trench is etched through the doped body region and into the epitaxial layer below the doped body region. Further, in an exemplary embodiment the region of the epitaxial layer below the vertical trench is doped to provide a breakdown voltage enhancement region, i.e., a region doped to increase breakdown voltage. In an exemplary embodiment, a gate electrode is formed in the vertical trench and source/drain active regions are formed at the surface of the epitaxial layer.

In an exemplary embodiment, conductive drain contacts are formed and extend from the surface of the epitaxial layer and into the buried drain layer. Exemplary conductive drain contacts provide low resistivity without lateral diffusion issues at the drain connection.

In exemplary embodiments, the methods provided herein for forming a trench-based VDMOS transistor are integrated into a BCD device process flow, such as for forming LDMOS devices and LV/MV CMOS devices. For example, such devices all share the same substrate, buried drain layer and epitaxial layer. Further, such devices may be formed using shared etching processes to form vias for isolation region formation and contact formation, shared doping processes to form wells, body regions, or active regions, and/or shared contact formation processes. Exemplary methods provided herein avoid use of high energy implantation and diffusion process using phosphorous oxychloride ($POCl_3$) and long duration drive-in processing to connect the buried drain layer to the device front side for drain connection. Further, exemplary methods provided herein avoid long duration LOCOS oxidation processing to form breakdown voltage enhancement regions.

FIGS. 1-14 illustrate a portion of an integrated circuit 10 during processing to form a VDMOS transistor, such as in a BCD process flow. As shown in FIG. 1, the integrated circuit 10 includes separate device regions 11, 12 and 13. In the embodiment of FIGS. 1-14, a trench-based VDMOS transistor is formed in region 11, an HV LDPMOS device is formed in region 12 and an HV LDNMOS device is formed in region 13. Other CMOS or DMOS devices may be formed in other regions through conventional BCD processing.

In FIG. 1, the partially fabricated integrated circuit 10 is formed on a substrate 14, such as a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 25 weight percent based on the total weight of the material unless otherwise indicated.

In FIG. 1, the exemplary substrate 14 is a bulk silicon wafer. An exemplary semiconductor substrate 14 is doped with P-type dopants, such as with boron. Further, the exemplary substrate 14 is formed with a resistivity of from about 8 to about 12 Ω·cm.

As shown, a buried drain layer 16 is formed over the substrate 14. An exemplary buried drain layer 16 is silicon. As used conventionally, a buried drain is located below active regions of a MOS device. An exemplary buried drain layer 16 is doped with N dopants. Further, an exemplary buried drain layer 16 is heavily N doped ("N+"). As used herein, "heavily" refers to doped layers having more than one dopant atom per one-hundred thousand atoms of semiconductor (such as silicon). In an exemplary embodiment, the buried drain layer 16 is formed by blanket deposition. For example, the buried drain layer 16 may be formed by a blanket deposition of in situ doped silicon, such as an in situ N doped silicon doped with phosphorus or arsenic, through a chemical vapor deposition (CVD) process.

In FIG. 1, an epitaxial layer 18 is formed over the buried drain layer 16. An exemplary epitaxial layer 18 is silicon. An exemplary epitaxial layer 18 is N doped. In an exemplary embodiment, the epitaxial layer 18 is in situ doped with an N dopant, such as with phosphorus or arsenic.

Figure 2:
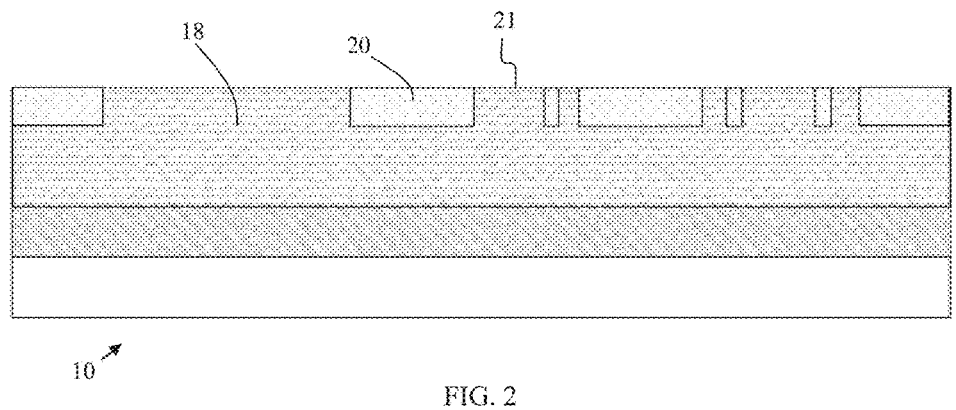

In FIG. 2, a conventional process is performed to form shallow isolation regions 20. For example, a mask may be formed and patterned over the partially fabricated integrated circuit 10. Then, an etch process is performed. The process may etch shallow trenches into the epitaxial layer 18. Thereafter, the shallow trenches are filled with an isolation material. For example, silicon oxide may be deposited over the epitaxial layer 18 and in the trenches. An overburden portion of the isolation material may be removed, such as by chemical mechanical planarization (CMP) to an upper surface 21 of the epitaxial layer 18 and to form the shallow isolation regions 20 as shown in FIG. 2.

Figure 3:
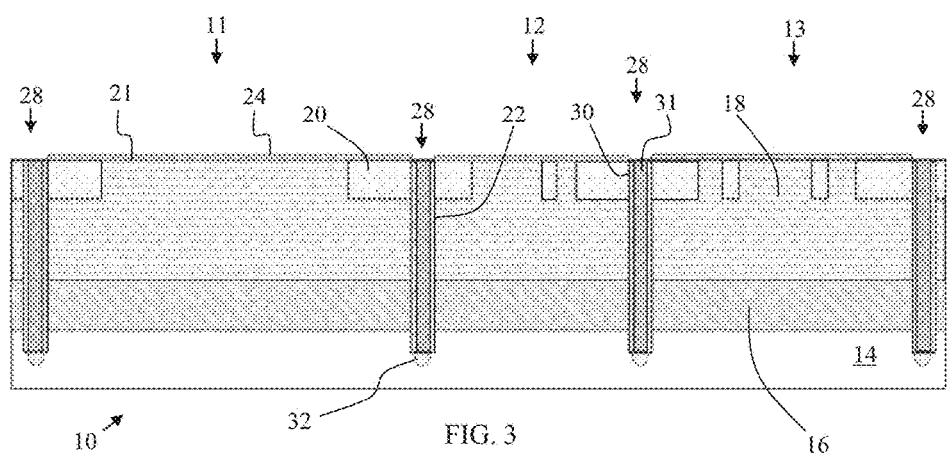

In FIG. 3, deep isolation trenches 22 are etched into the partially fabricated integrated circuit 10. For example, a mask 24 such as a hard mask is formed and patterned over the upper surface 21 of the epitaxial layer 18. An exemplary hard mask 24 includes a silicon nitride layer overlying a pad oxide layer that promotes adhesion between the surface 21 and the silicon nitride layer. The hard mask 24 is patterned to provide openings corresponding to the locations where deep isolation trenches 22 are to be formed. Patterning of the hard mask 24 can be achieved using conventional lithographic techniques. For example, a photoresist layer (not shown) may be deposited over the hard mask 24 and patterned by selective exposure. The patterned resist layer serves as an etch mask for patterning the hard mask. After etching openings into the hard mask 24, an etch process is performed to etch completely through the shallow isolation regions 20, epitaxial layer 18 and buried drain layer 16 and into the substrate 14 to form deep isolation trenches 22. In an exemplary embodiment, a reactive-ion-etch (RIE) process is used.

After forming the deep isolation trenches 22, processing may continue to form deep isolation regions 28 in the trenches 22. As shown, the deep isolation regions 28 separate and isolate the device regions 11, 12 and 13 from one another.

In an exemplary embodiment, the deep isolation regions 28 are capacitive isolation regions including an insulating liner 30 and a conductive core 31. The conductive core 31 is insulated from the sidewalls of the trenches 22 by the insulating liner 30. An exemplary insulating liner 30 is silicon oxide. In an exemplary embodiment, the insulating liner 30 may be formed by a conformal deposition process. An anisotropic etch may be used to remove the liner 30 from the bottom of the trenches 22. Thereafter, a conductive material may be deposited to form the conductive core 31. An exemplary conductive core 31 is polycrystalline silicon (polysilicon). In an exemplary embodiment, the conductive core material is deposited by CVD and forms an overburden portion outside of the trenches 22 that may be removed by CMP.

In certain embodiments, implant regions 32 may be formed at the bottom of the deep isolation trenches 22. For example, an implantation process may be used to dope the regions of the substrate 14 at the bottom of the trenches 22 before deposition of the conductive core material. In an exemplary embodiment, the implant regions 32 are heavily P-doped (P+) implant regions and may be formed with a suitable heavily doped P+ implantation process. As the conductive core 31 contacts the bottom of the trenches 22, an ohmic contact may be formed between the conductive core 31 of each deep isolation region 28 and the implant regions 32 of the substrate 14.

Figure 4:
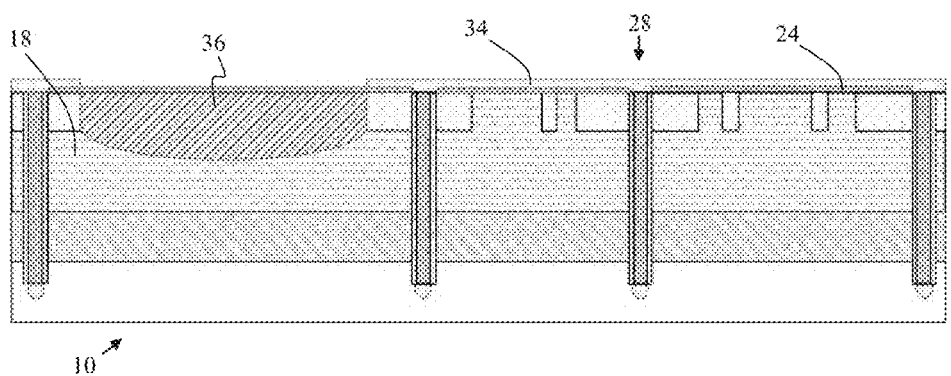

The method may continue as shown in FIG. 4, where an implant mask 34 is formed and patterned over the epitaxial layer 18, hard mask 24, and deep isolation regions 28. An exemplary implant mask 34 is photoresist. As shown, an implantation process is performed to form a body region 36 in the epitaxial layer 18 of the device area 11. An exemplary body region 36 is doped with P type dopants. For example, an implantation process may be performed to implant boron dopant ions into the epitaxial layer 18 to form the body region 36.

Figure 5:
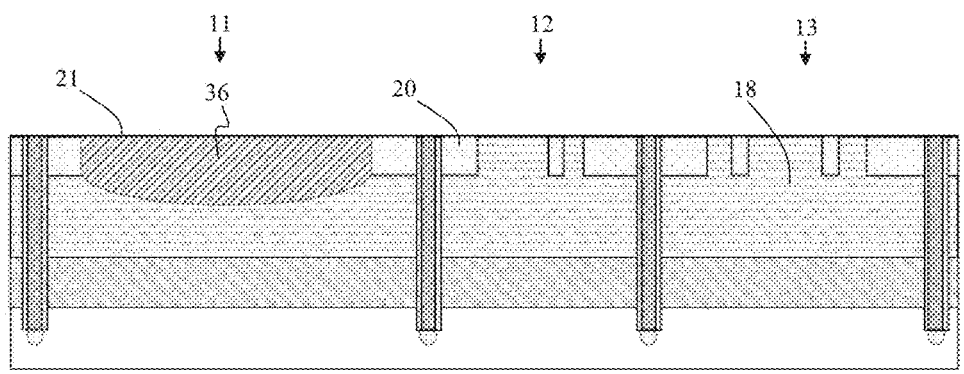

After formation of the body region 36, the implant mask 34 and hard mask 24 may be removed to reveal surface 21, as shown in FIG. 5. For example, a photoresist strip process, and oxide strip process may be performed. Also, a dopant "drive in" or anneal process may be performed for the body region 36.

Figure 6:
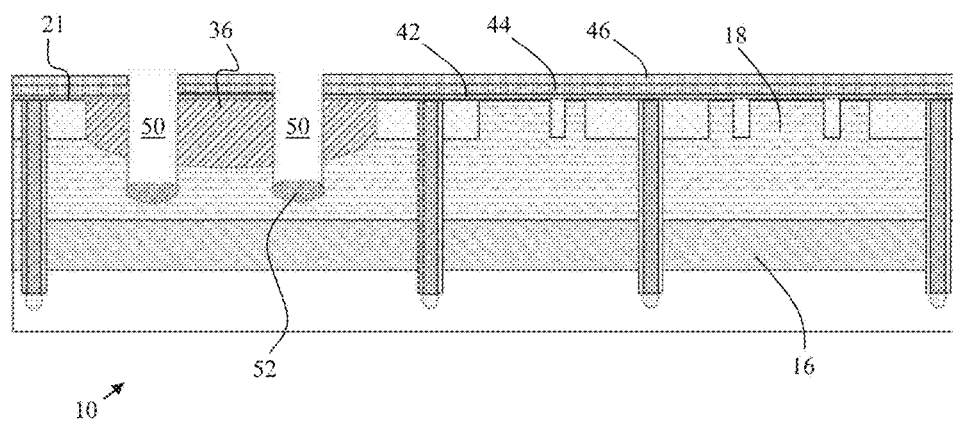

In FIG. 6, layers 42, 44, and 46 are formed and patterned for the etching of vertical gate trenches 50. In an exemplary embodiment, a pad oxide layer 42 is deposited over the surface 21. For example, layer 42 may be deposited by a chemical vapor deposition (CVD) process. In an exemplary embodiment, a hard mask layer 44 is deposited over the layer 42. An exemplary hard mask layer 44 is silicon oxide. In an exemplary embodiment, the hard mask layer 44 is deposited by CVD or plasma-enhanced CVD. An exemplary layer 46 is a photoresist mask. Photoresist mask layer 46 may be selectively exposed and used as a mask to etch hard mask layer 44 and pad oxide layer 42 to selectively reveal locations of the epitaxial layer 18 where vertical gate trenches 50 are to be formed. As shown, an etch process etches the vertical gate trenches 50 through the body region 36 of the epitaxial layer 18 and into the region of the epitaxial layer 18 below the body region 36. In an exemplary embodiment, an RIE process is performed to etch the vertical gate trenches 50.

As shown in FIG. 6, a doping process may be performed to form breakdown voltage enhancement regions 52 at the bottom of the trenches 50. For example, an implantation process may implant P type dopants to form lightly P doped regions 52 in the exemplary N doped epitaxial layer 18. After formation of gates in the trenches 50, the regions 52 may act as P type floating areas for improving electric field distribution between the bottom of the gate trench 52 and the buried drain layer 16 such that the breakdown voltage can be enhanced.

Figure 7:
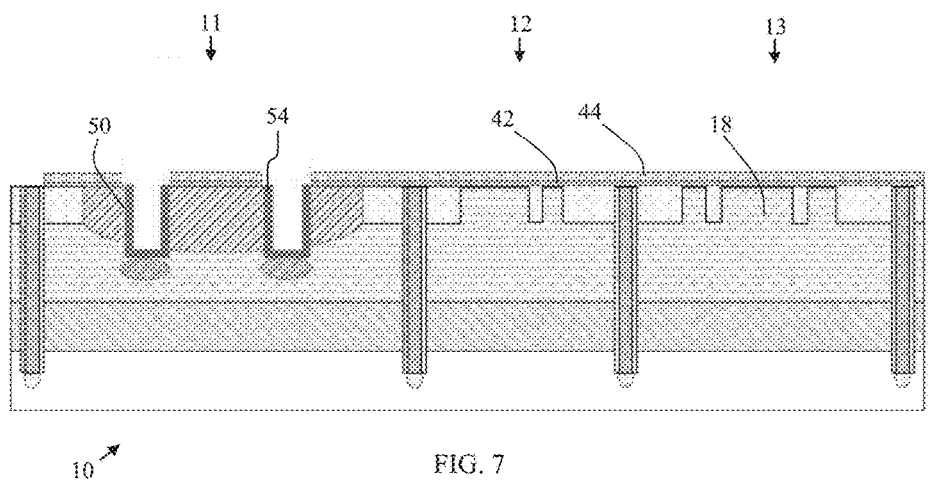

In FIG. 7, the photoresist layer 46 is removed such as by a photoresist strip process. A pre-clean process may be performed, followed by the formation of gate dielectric liner 54 along the exposed bottom and side surfaces of the trenches 50. For example, silicon oxide may be formed as the gate dielectric liner 54. In an exemplary embodiment, the gate dielectric liner 54 may be formed by a thermal oxidation process.

Figure 8:
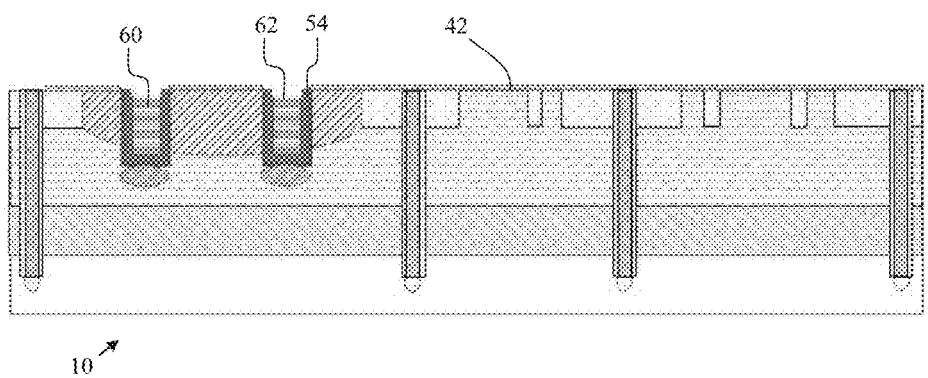

The method may continue in FIG. 8, with cross reference to FIG. 7, with the formation of gate material 60 in the trenches 50. An exemplary gate material 60 is polysilicon, such as heavily N doped polysilicon. In an exemplary embodiment, the gate material 60 is deposited by a low pressure CVD process. Deposition of the gate material 60 results in an overburden portion that may be removed by a CMP process. In an exemplary embodiment, the gate material 60 is recessed to a surface 62 within the trenches 50 by an etch back process. Then, the hard mask layer 44 may be removed. For example, a nitride strip process may be performed to remove the hard mask layer 44.

Figure 9:
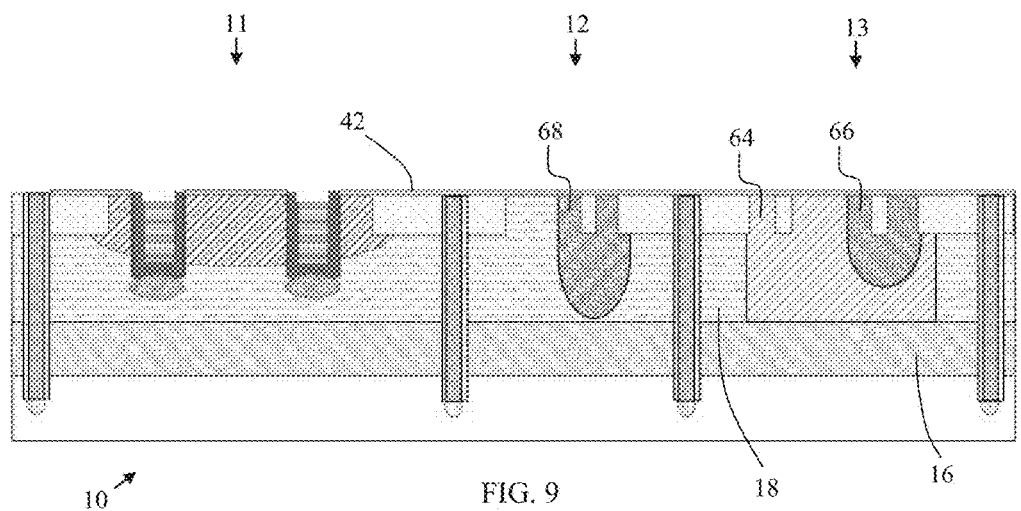

In FIG. 9, masks (not shown) may be formed and patterned over the partially fabricated integrated circuit 10 and implantation processes may be performed to form implant regions 64, 66 and 68 in the device regions 12 and 13. For example, an implantation process may be performed to form a high voltage device P well 64 in device region 13. Further, an implantation process may be performed to form a high voltage device N doped, double doped drain (DDD) region 66 in device region 13. Also, an implantation process may be performed to form a high voltage device P doped DDD region 68 in device region 12. The masks and the layer 42 may then be removed.

Figure 10:
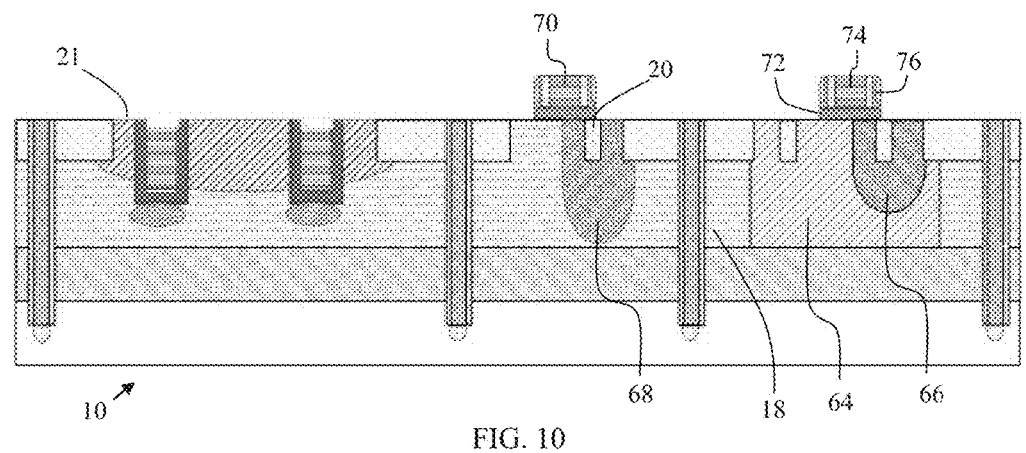

Further processing of device regions 12 and 13 is illustrated in FIG. 10. As shown, a gate structure 70 is formed over the surface 21 of the partially fabricated integrated circuit in the device regions 12 and 13. Each gate structure 70 includes a gate dielectric 72 and gate electrode 74. Exemplary processing includes blanket deposition of a suitable gate dielectric layer, such as silicon oxide, and blanket deposition of a suitable gate electrode material, such as polysilicon. Then the gate dielectric layer and gate electrode material are etched to form the gate dielectric 72 and gate electrode 74 as shown. Further, a spacer or spacers 76 may be formed around the gate electrode 74 before etching the gate dielectric 72.

Figure 11:
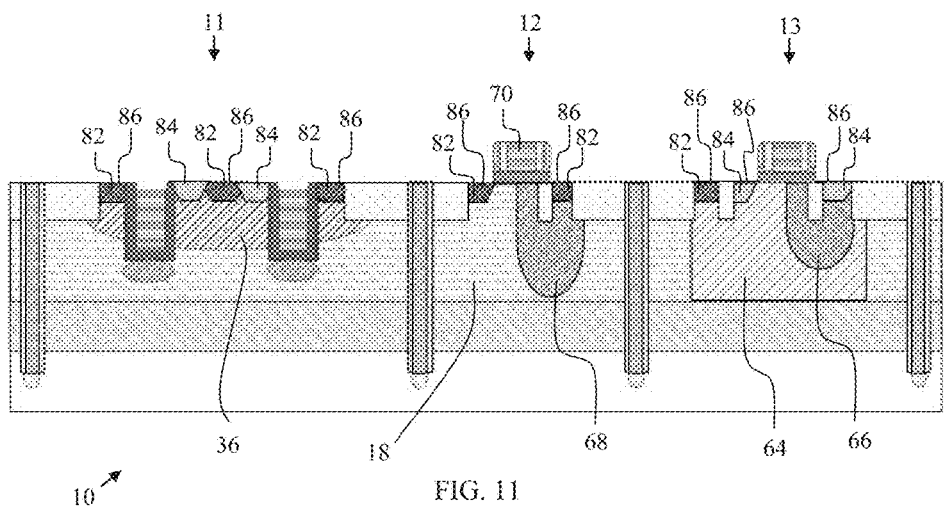

The method may continue in FIG. 11 with the formation of active regions 82 and 84 in the device regions 11, 12 and 13. For example, a mask may be formed and patterned and used, with the gate structures 70 for alignment of active regions 82 and 84. In an exemplary embodiment, heavily P doped regions 82 are formed in the device regions 11, 12 and 13, and heavily N doped regions 84 are formed in the device regions 11 and 13. It is understood that a variety of arrangements of active regions 82 and 84 may be provided depending on the desired device formation. Further, a silicidation process may be performed to form silicide contacts to selected active regions through conventional masking, deposition and annealing techniques. For example, silicide contacts 86 may be formed on each of the heavily P doped regions 82 and on the heavily N doped regions 84 in device region 13.

Figure 12:
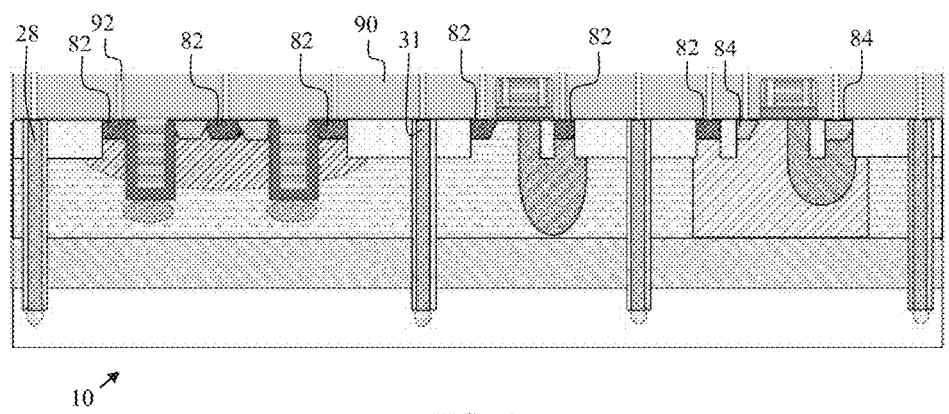

In FIG. 12, an interlayer dielectric 90 is deposited over the partially fabricated integrated circuit 10. Then, a contact etch process is performed with appropriate masking to selectively form vias 92 through the interlayer dielectric 90 and in contact with the conductive cores 31 in the deep isolation regions 28, each of the heavily P doped regions 82, and the heavily N doped regions 84 in device region 13.

Figure 13:
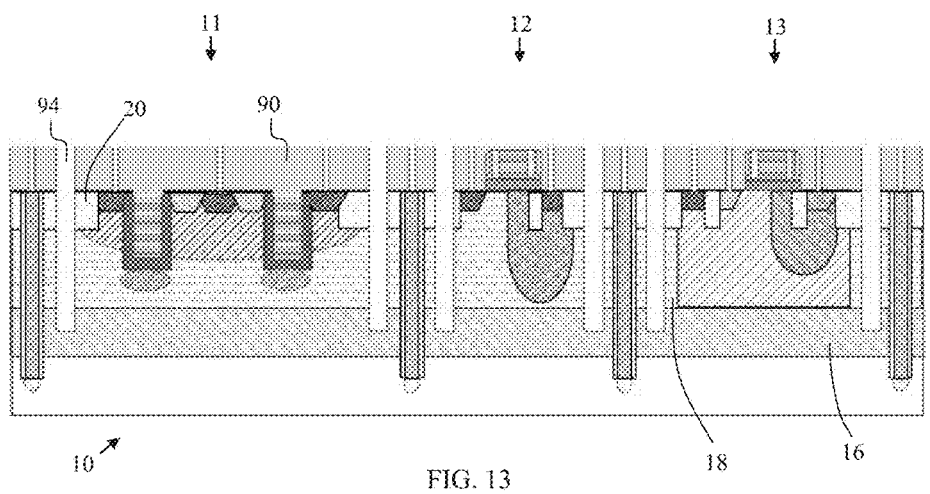
Figure 14:
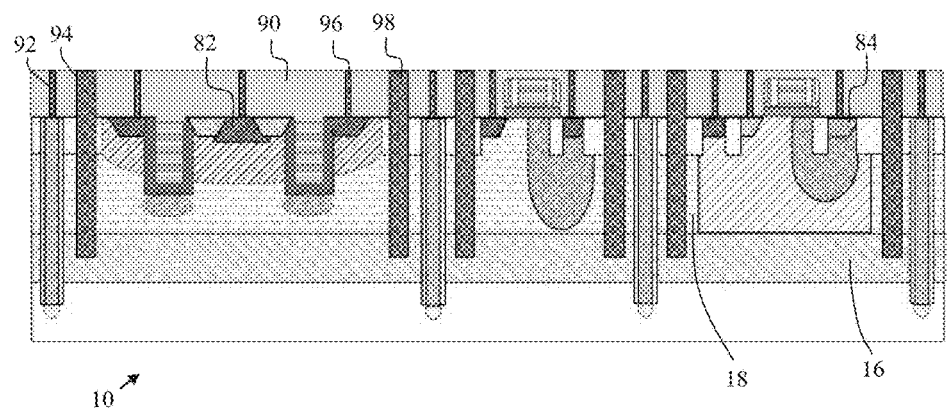

In FIG. 13, a further selective etch process is performed to form deep trenches 94 through the interlayer dielectric 90, the shallow isolation regions 20, and the epitaxial layer 18, and into the buried drain layer 16. In FIG. 14, a conductive material is deposited to fill the vias 92 and deep trenches 94 to form electrical connections 96 and drain contacts 98. An exemplary conductive material is tungsten or another suitable metal. In an exemplary embodiment, the conductive material is deposited by sputtering. Further, an exemplary embodiment forms an overburden portion of the conductive material that may be removed by CMP to the surface of the interlayer dielectric material 90.

Further processing may be performed to form the appropriate electrical circuits to electrical connections 92 and drain contacts 94. For example, ground terminals, drain terminals, source terminals, body terminals, source/body terminals, well terminals, and DVN terminals may be formed and appropriately connected to selected electrical connections 92 and drain contacts 94.

As a result of the processing described in FIGS. 1-14, a trench-based VDMOS transistor is formed in device region 11, an LDPMOS transistor is formed in the device region 12, and an LDNMOS transistor is formed in the device region 13. Conventional processing may form other desired transistor structures in device regions 12 and/or 13. Further, while exemplary embodiments of N doped or P doped elements have been described, the dopant types may be reversed, such that elements described as N doped are P doped, and elements described as P doped are N doped. Further, a VDMOS conductive structure 98 extends through the epitaxial layer and into the buried layer 16 in the VDMOS region 11, wherein the buried layer 16 is a drain for the VDMOS transistor and the VDMOS conductive structure 98 is a drain contact to the buried layer 16.

Figure 15:
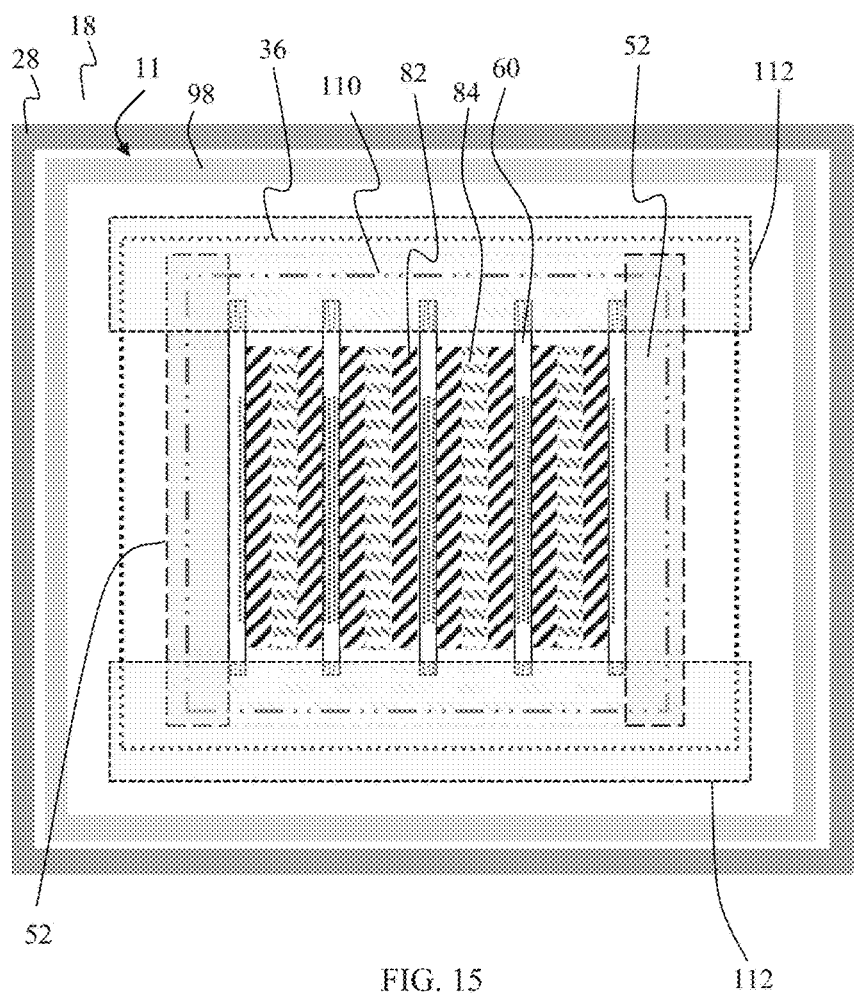
FIG. 15 provides an overhead schematic of a trench-based VDMOS transistor as formed according to an embodiment herein.

FIG. 15 is an overhead schematic showing selected elements of an embodiment of a VDMOS transistor in device region 11 as formed according to the method of FIGS. 1-14. As shown, the deep trench isolation region 28 is formed through the epitaxial layer 18 and has an annular shape, thereby isolating device region 11. The drain contact 98 is also shown to be annular for connection to the underlying buried drain layer. The body region 36 extends under an active area 110 including active regions 82 and 84. As shown, gate electrodes 60 are aligned with the active regions 82 and 84.

FIG. 15 further illustrates the breakdown voltage enhancement regions 52 extending from under the gate electrodes 74. As shown, the breakdown voltage enhancement regions 52 extends underneath gate electrodes 74 and is electrical connected at either end to high voltage DDD regions 112 for final connection to the body.

As described herein, trench-based VDMOS transistors are provided, including trench-based VDMOS transistors formed on an integrated circuit including other BCD devices. The methods for forming VDMOS transistors and BCD devices may be employed without using high energy implantation and diffusion processes using phosphorous oxychloride (POCl$_3$) or long duration drive-in processing to connect the buried drain layer to the device front side for drain connection. Also, the methods for forming VDMOS transistors and BCD devices avoid long duration LOCOS oxidation processing to form breakdown voltage enhancement regions. Instead, such regions may be formed through implantation processes.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A bipolar-CMOS-DMOS (BCD) device including a vertical diffused metal oxide semiconductor (VDMOS) transistor, the BCD device comprising:
   a buried layer over a substrate;
   an epitaxial layer over the buried layer and having an upper surface;
   deep trench isolation regions extending from the upper surface of the epitaxial layer, through the buried layer, and into the substrate, wherein the deep trench isolation regions isolate a VDMOS region from a device region of the epitaxial layer;
   a source region adjacent the upper surface of the epitaxial layer in the VDMOS region;
   a vertical gate structure extending into the epitaxial layer in the VDMOS region;
   a body region of the epitaxial layer located adjacent the vertical gate structure in the VDMOS region, wherein the body region forms a channel; and
   a VDMOS conductive structure extending through the epitaxial layer and into the buried layer in the VDMOS region, wherein the buried layer is a drain for the VDMOS transistor and the VDMOS conductive structure is a drain contact to the buried layer.

2. The BCD device of claim 1 wherein the deep trench isolation regions isolate the VDMOS region, a lateral diffused p-channel metal oxide semiconductor (LDPMOS) region, and a lateral diffused n-channel metal oxide semiconductor (LDNMOS) region, and wherein the BCD device further comprises a LDPMOS gate structure over the LDPMOS region and a LDNMOS gate structure over the LDNMOS region.

3. The BCD device of claim 1 wherein each deep trench isolation region comprises a conductive core material, and wherein an implant region is formed in the substrate below each deep trench isolation region and in contact with the conductive core material to form an ohmic contact between each conductive core and the respective implant region.

4. The BCD device of claim 1 wherein the vertical gate structure is located in a trench in the epitaxial layer, and wherein the BCD device further comprises a breakdown voltage enhancement region in the epitaxial layer below the trench.

5. The BCD device of claim 1 wherein:
   the substrate is a P doped substrate;
   the buried layer is a heavily N doped buried layer;
   the epitaxial layer is an N doped epitaxial layer;
   the vertical gate structure is located in a trench in the epitaxial layer; and
   the BCD device further comprises a P doped breakdown voltage enhancement region in the epitaxial layer below the trench.

6. A vertical diffused metal oxide semiconductor (VDMOS) transistor comprising:
   a buried drain formed over a substrate;
   an epitaxial layer located over the buried drain and having an upper surface;
   a doped source region at the upper surface of the epitaxial layer;
   first and second shallow isolation regions at the upper surface of the epitaxial layer;
   a vertical gate structure extending into the epitaxial layer, wherein the vertical gate structure is a gate electrode for the VDMOS transistor;
   a body region located below the doped source region and adjacent the vertical gate structure and extending from the first shallow isolation region to the second shallow isolation region, wherein the body region forms a channel of the VDMOS transistor, and wherein current flows between the doped source region and the buried drain in a direction transverse to the upper surface; and
   a conductive structure extending through the first shallow isolation region, through the epitaxial layer and into the buried drain, wherein the conductive structure is a drain contact to the buried drain.

7. The VDMOS transistor of claim 6 wherein the vertical gate structure includes a conductive gate material and a gate dielectric layer between the conductive gate material and the epitaxial layer to electrically isolate the conductive gate material.

8. The VDMOS transistor of claim 6 further comprising a deep isolation region extending from the upper surface of the epitaxial layer and into the substrate, wherein the deep isolation region isolates the VDMOS transistor.

9. The VDMOS transistor of claim 6 wherein:
   the substrate is P doped;
   the buried drain is heavily N doped;
   the epitaxial layer is N doped;
   the body region is P doped.

10. The VDMOS transistor of claim 6 wherein the substrate is P doped, the buried drain is heavily N doped, the epitaxial layer is N doped, and the body region is P doped; and wherein the VDMOS transistor further comprises a P doped region formed within the epitaxial layer below the vertical gate structure.

11. The VDMOS transistor of claim 6 further comprising a shallow isolation region formed at the upper surface of the epitaxial layer, wherein the vertical gate structure passes through the shallow isolation region.

12. The VDMOS transistor of claim 6 further comprising:
   a dielectric layer overlying the upper surface of the epitaxial layer; and
   conductive vias formed through the dielectric layer and in electrical contact with the doped source region and the drain contact.

13. The VDMOS transistor of claim 6 wherein the doped source region adjacent the upper surface of the epitaxial layer comprises a first heavily doped region, and wherein the VDMOS transistor further comprises a second heavily doped region adjacent the upper surface of the epitaxial layer forming a body contact region.

14. The VDMOS transistor of claim 6 wherein the doped source region adjacent the upper surface of the epitaxial layer comprises a first heavily doped region, and wherein the VDMOS transistor further comprises:
   a second heavily doped region adjacent the upper surface of the epitaxial layer forming a first body contact region; and a third heavily doped region forming a second body contact region.

15. The VDMOS transistor of claim 6 further comprising a deep isolation region extending from the upper surface of the epitaxial layer and into the substrate, wherein the deep isolation region isolates the VDMOS transistor, wherein the deep trench isolation region comprises a conductive core material, and wherein an implant region is formed in the substrate below the deep trench isolation region and in contact with the conductive core material to form an ohmic contact between the conductive core and the implant region.

16. A method for fabricating an integrated circuit with a bipolar-CMOS-DMOS (BCD) device, the method comprising:
providing a substrate;
forming a buried layer over the substrate;
growing an epitaxial layer over the buried layer, wherein the epitaxial layer has an upper surface;
forming deep trench isolation regions extending from the upper surface of the epitaxial layer and into the substrate, wherein the deep trench isolation regions isolate a vertical diffused metal oxide semiconductor (VDMOS) region of the epitaxial layer and a laterally diffused MOS (LDMOS) region;
doping the epitaxial layer in the LDMOS region to form a doped region;
forming a LDMOS gate structure over the epitaxial layer in the LDMOS region;
forming a body region at the upper surface of the epitaxial layer in the VDMOS region;
forming a vertical gate structure extending through the body region and into the epitaxial layer in the VDMOS region, wherein the vertical gate structure is a VDMOS gate electrode;
forming LDMOS source/drain regions at the upper surface of the epitaxial layer in the LDMOS region;
forming a VDMOS source region at the upper surface of the epitaxial layer in the VDMOS region;
forming a conductive structure extending through the epitaxial layer and into the buried layer in the LDMOS region; and
forming a conductive structure extending through the epitaxial layer and into the buried layer in the VDMOS region, wherein the buried layer in the VDMOS region is a VDMOS drain, and wherein the conductive structure is a drain contact to the VDMOS drain.

17. The method of claim 16 wherein forming the vertical gate structure comprises etching the epitaxial layer to form a trench with a bottom surface and forming the vertical gate structure in the trench; and wherein the method further comprises doping the epitaxial layer below the bottom surface of the trench to form a breakdown voltage enhancement region.

18. The method of claim 16 wherein forming a buried layer over the substrate comprises depositing a doped material over the substrate.

19. The method of claim 16 wherein:
providing the substrate comprises providing a P doped substrate;
forming the buried layer over the substrate comprises depositing a heavily N doped buried layer over the substrate; and
growing the epitaxial layer over the buried layer comprises growing an N doped epitaxial layer over the buried layer.

20. The method of claim 16 wherein:
providing the substrate comprises providing a P doped substrate;
forming the buried layer over the substrate comprises depositing a heavily N doped buried layer over the substrate;
growing the epitaxial layer over the buried layer comprises growing an N doped epitaxial layer over the buried layer;
forming the vertical gate structure comprises etching the epitaxial layer to form a trench with a bottom surface and forming the vertical gate structure in the trench; and
the method further comprises doping the epitaxial layer below the bottom surface of the trench to form a P doped breakdown voltage enhancement region.

* * * * *